US008587056B2

(12) United States Patent
Lee et al.

(10) Patent No.: US 8,587,056 B2
(45) Date of Patent: Nov. 19, 2013

(54) HIGH-VOLTAGE METAL-OXIDE-SEMICONDUCTOR DEVICE

(75) Inventors: Ming-Cheng Lee, Hsinchu County (TW); Tao Cheng, Hsinchu (TW); Ming-Tzong Yang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 35 days.

(21) Appl. No.: 13/419,443

(22) Filed: Mar. 14, 2012

(65) Prior Publication Data
US 2012/0168862 A1 Jul. 5, 2012

Related U.S. Application Data

(62) Division of application No. 12/345,676, filed on Dec. 30, 2008, now abandoned.

(51) Int. Cl.
*H01L 29/66* (2006.01)

(52) U.S. Cl.
USPC ...... 257/336; 257/344; 257/408; 257/E29.266

(58) Field of Classification Search
USPC ............................ 257/336, 344, 408, E29.266
See application file for complete search history.

(56) References Cited

U.S. PATENT DOCUMENTS

2008/0191272 A1    8/2008  Takeda

*Primary Examiner* — Tan N Tran
(74) *Attorney, Agent, or Firm* — Winston Hsu; Scott Margo

(57) ABSTRACT

A high-voltage MOS transistor includes a gate overlying an active area of a semiconductor substrate; a drain doping region pulled back away from an edge of the gate by a distance L; a first lightly doped region between the gate and the drain doping region; a source doping region in a first ion well; and a second lightly doped region between the gate and the source doping region.

8 Claims, 8 Drawing Sheets

HIGH-VOLTAGE METAL-OXIDE-SEMICONDUCTOR DEVICE

CROSS REFERENCE TO RELATED APPLICATIONS

This application is a Division of pending U.S. patent application Ser. No. 12/345,676, filed Dec. 30, 2008, the entirety of which is incorporated by reference herein.

BACKGROUND OF THE INVENTION

1. Field of the Invention

The present invention relates to a high-voltage device structure. More particularly, the present invention relates to a high-voltage metal-oxide-semiconductor (HVMOS) device structure.

2. Description of the Prior Art

High-voltage metal-oxide-semiconductors are MOS devices for use under high voltages, which may be, but not limited to, voltages higher than the voltage supplied to the I/O circuit. HVMOS devices may function as switches and are broadly utilized in audio output drivers, CPU power supplies, power management systems, AC/DC converters, LCD or plasma television drivers, automobile electronic components, PC peripheral devices, small DC motor controllers, and other consumer electronic devices.

FIG. 1 is a schematic, cross-sectional view of a conventional high-voltage NMOS device. As shown in FIG. 1, the high-voltage NMOS device 101 includes a gate 210 overlying an area of a P type substrate 100, a deep N well (DNW) 110 formed in the substrate 100, an N well 120 formed in the substrate 100 proximate a first edge 210a of the gate 210 and doped with a first concentration of an N type dopant, a channel region 130 doped with a first concentration of a P type dopant underlying a portion of the gate 210 adjacent the N well 120, a shallow trench isolation (STI) region 160 formed in the first portion of the N well 120, and an N$^+$ tap region 150 to the second portion of the N well 120 distal from the first edge 210a of the gate 210. An N type source region 155 including an N$^+$ region and an N type lightly doped region 155b is formed in the P well 140 proximate a second edge 210b of the gate 210 opposite to the first edge 210a.

The N$^+$ tap region 150 is formed between the STI region 160 and the STI region 162. The N$^+$ tap region 150 is not self-aligned with the gate 210 but is separated from the gate 210 by a distance D. The above-described high-voltage NMOS device 101 utilizes STI region 160 to drop drain voltage and makes high drain sustained voltage. Besides, the above-described high-voltage NMOS device 101 can use well implant to form drain terminal.

However, the above-described high-voltage NMOS device 101 cannot be operated when the drain is negatively biased because the junction between the DNW 110 and the P type substrate 100 will be turned on and thus causes leakage. In some circumstances, it is desirable to have a high-voltage NMOS device and the drain terminal thereof can be negatively biased.

SUMMARY OF THE INVENTION

It is one objective of this invention to provide an improved HVMOS device structure that is COMS compatible and is operable when the drain terminal is negatively biased.

It is another objective of this invention to provide an improved HVMOS device structure with improved time dependent dielectric breakdown (TDDB) characteristic and reduced hot carrier injection (HCI) effect.

To these ends, according to one aspect of the present invention, there is provided a high-voltage MOS transistor comprising a gate overlying an active area of a semiconductor substrate; a drain doping region of a first conductivity type pulled back away from an edge of the gate by a distance L; a first lightly doped region of the first conductivity type between the gate and the drain doping region; a source doping region of the first conductivity type in a first ion well of a second conductivity type; and a second lightly doped region of the first conductivity type between the gate and the source doping region.

From one aspect of this invention, a high-voltage MOS transistor comprises a gate overlying an active area of a semiconductor substrate; a drain structure of a first conductivity type at one side of the gate, wherein the drain structure comprises a first heavily doping region spaced apart from a second heavily doping region that is proximate to the gate, a first lightly doped region interposed between the first and second heavily doping regions, and a second lightly doped region between the gate and the second heavily doping region; a source doping region of the first conductivity type in a first ion well of a second conductivity type at the other side of the gate; and a third lightly doped region of the first conductivity type between the gate and the source doping region.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

The exemplary structures of HVMOS transistor according to the present invention are described in detail. The improved HVMOS transistor structure is described for a high-voltage NMOS transistor, but it should be understood by those skilled in the art that by reversing the polarity of the conductive dopants high-voltage PMOS transistors can be made.

Figure 1:
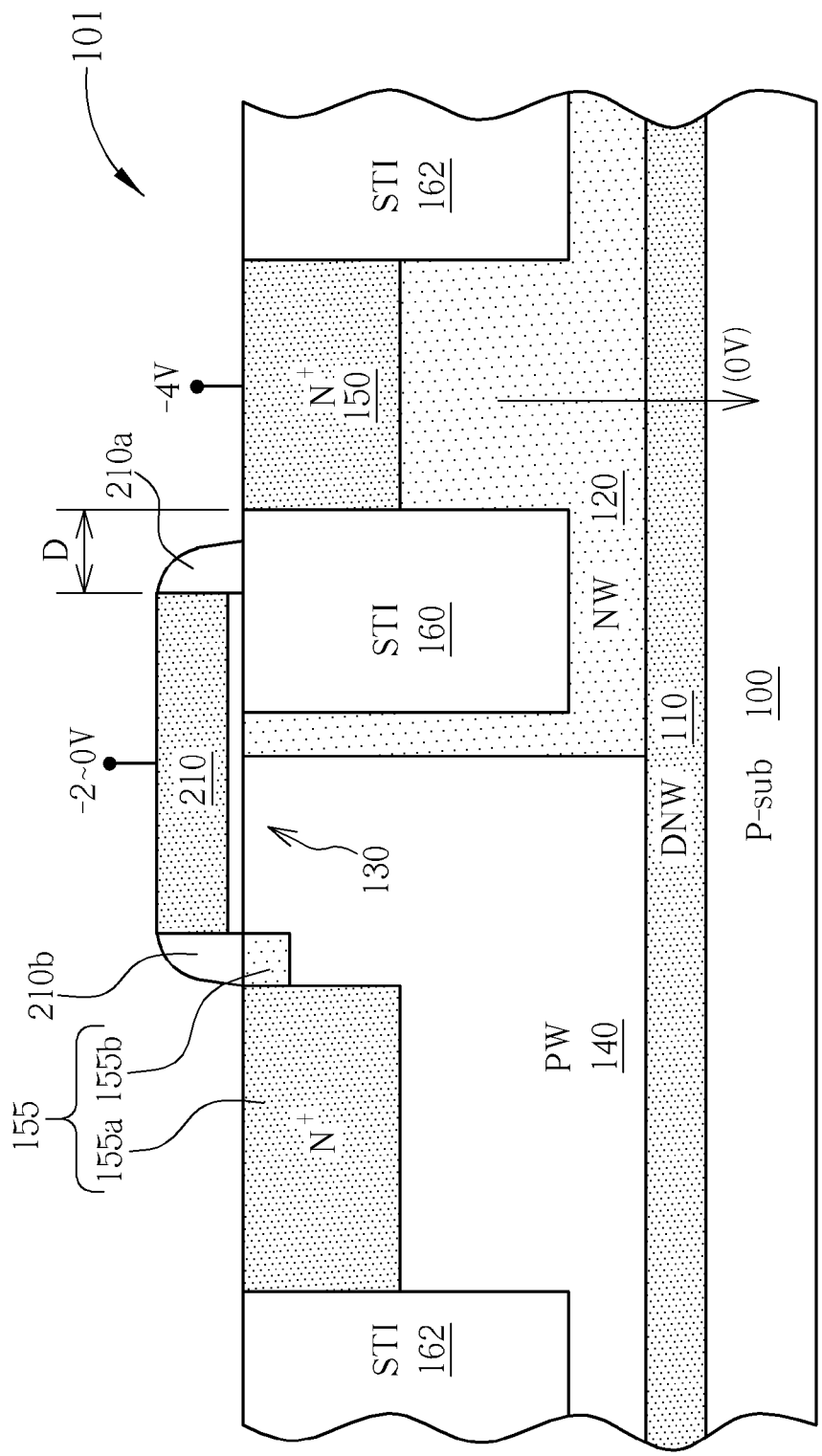
FIG. 1 is a schematic, cross-sectional diagram illustrating a conventional high-voltage NMOS device.
Figure 2:
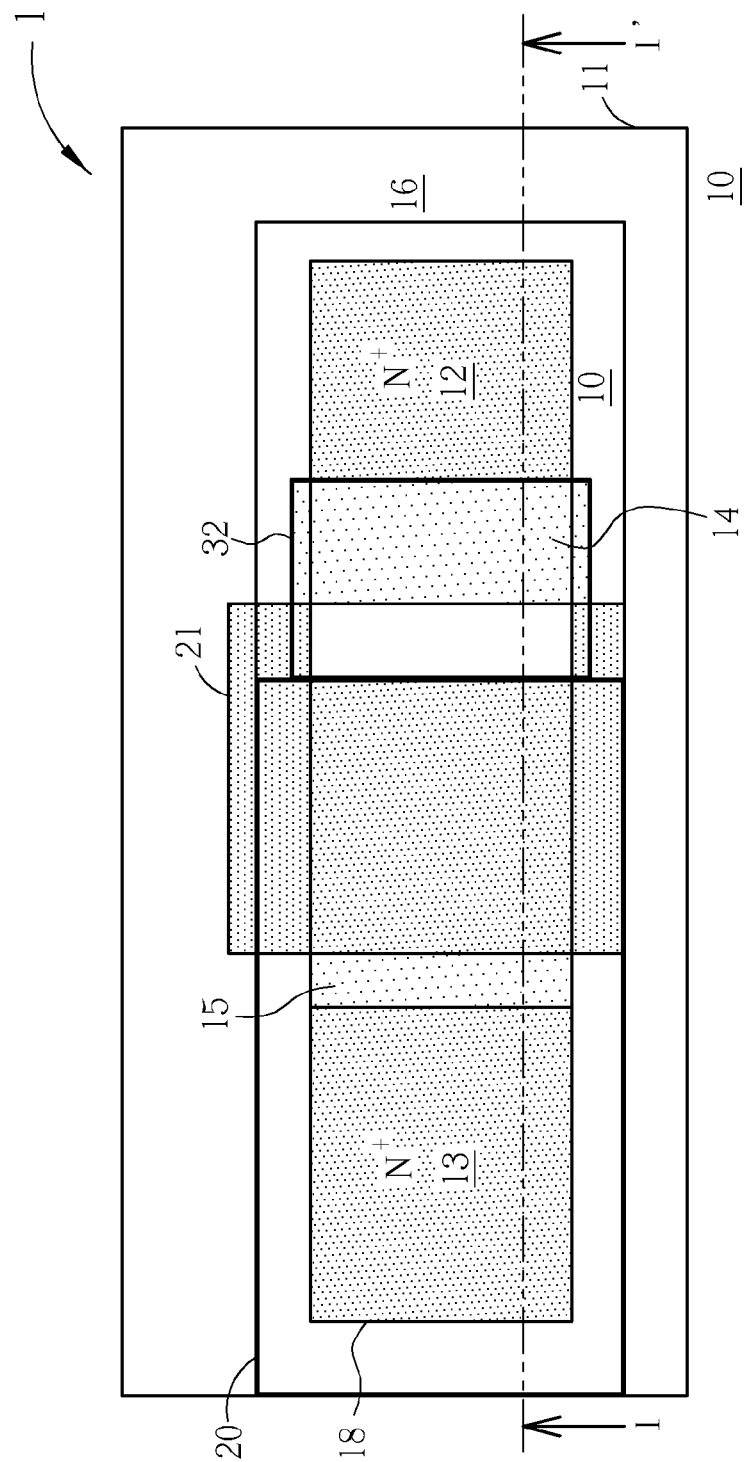
FIG. 2 is an exemplary layout of the improved HVMOS structure in accordance with one embodiment of this invention.
Figure 3:
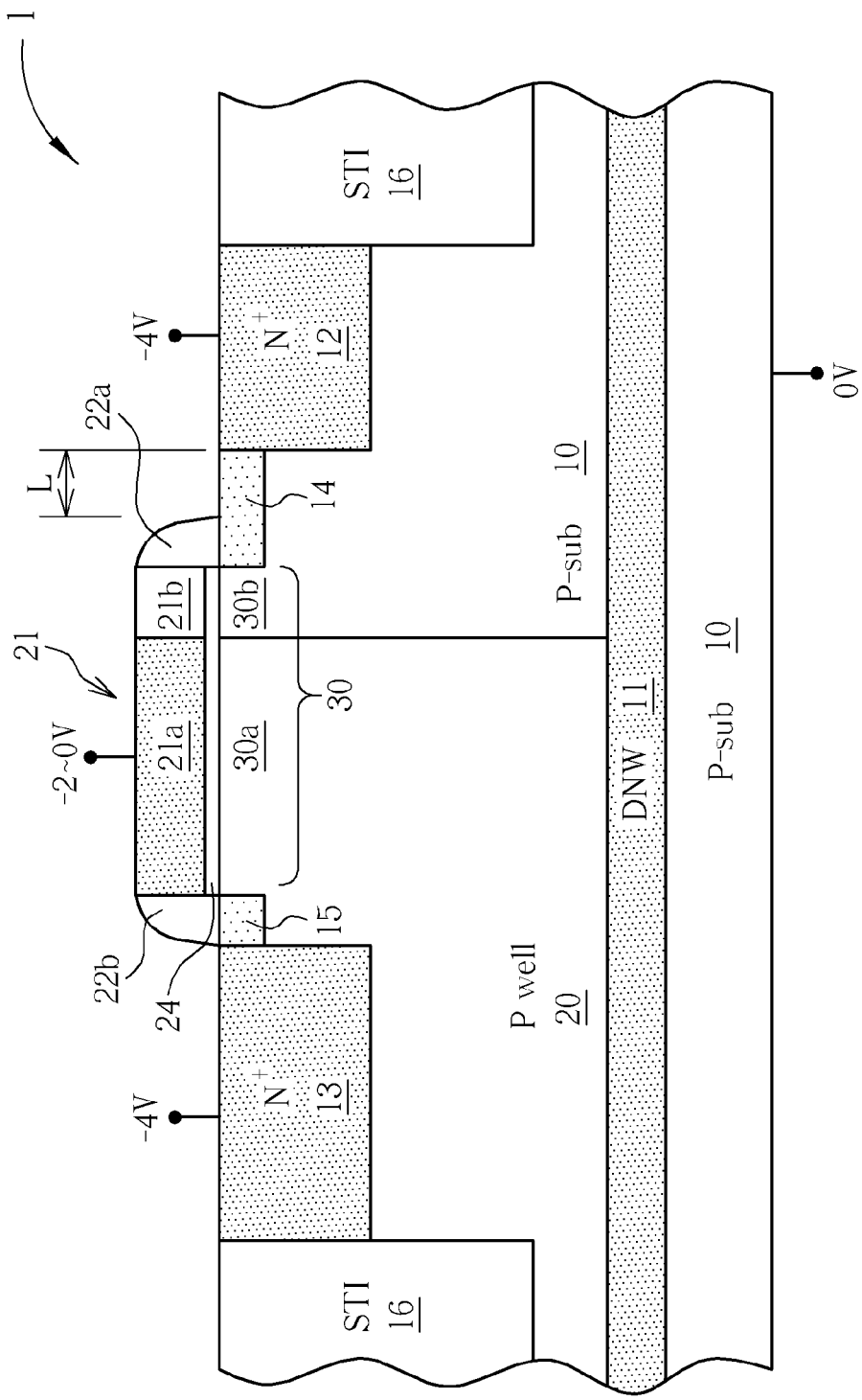
FIG. 3 is a schematic, cross-sectional view taken alone line I-I' of FIG. 2.

FIG. 2 is an exemplary layout of the improved high-voltage NMOS transistor structure in accordance with one embodiment of this invention. FIG. 3 is a schematic, cross-sectional view taken alone line I-I' of FIG. 2. As shown in FIGS. 2 and 3, the high-voltage NMOS transistor 1 is formed in an active area or oxide defined (OD) area 18 that is surrounded by a shallow trench isolation (STI) region 16. The high-voltage NMOS transistor 1 comprises a gate 21 overlying the active area 18. The gate 21 may comprise polysilicon, metal, silicide or a combination thereof. The high-voltage NMOS transistor 1 further comprises a deep N well (DNW) 11 formed in the P type silicon substrate 10 for bulk isolation. It is worth noted that the DNW 11 may be omitted in some PMOS cases.

On one side of the gate 21, an $N^+$ drain doping region 12 is implanted into the active area 18 of the P type silicon substrate 10 that has a first concentration of P type dopants. It is one germane feature of this invention that the $N^+$ drain doping region 12 is not aligned with the edge of the gate 21 and is pulled back away from the edge of the gate by a distance L. By doing this, the voltage drop of drain side is increased and the time dependent dielectric breakdown (TDDB) of the gate dielectric layer 24 between the gate 21 and the drain is improved. An N type lightly doped region 14 is disposed between the edge of the gate 21 and the $N^+$ drain doping region 12. The N type lightly doped region 14 extends laterally underneath a sidewall spacer 22a that is formed on a sidewall of the gate 21.

On the other side of the gate 21, an $N^+$ source doping region 13 is implanted into a P well 20 within the active area 18. The P well 20 has a second concentration of P type dopants that is higher than the first concentration. The $N^+$ source doping region 13 is substantially aligned with the edge of the gate 21. An N type lightly doped region 15 is provided underneath the sidewall spacer 22b opposite to the sidewall spacer 22a. Since the $N^+$ drain doping region 12 is formed in the P type silicon substrate 10 instead of formed in a P well, the hot carrier injection (HCI) effect can be reduced.

A channel region 30 is defined between the N type lightly doped region 14 and the N type lightly doped region 15 under the gate 21. As best seen in FIG. 3, the channel region 30 may comprise a first portion 30a of the P well 20 and a second portion 30b of the P type silicon substrate 10. Accordingly, the high-voltage NMOS transistor 1 has different P type doping concentrations across the channel region 30. A gate dielectric layer 24 such as silicon dioxide is formed between the gate 21 and the channel region 30.

It is another feature of the present invention that the gate 21 may comprise two portions: the first portion 21a and the second portion 21b. The first portion 21a of the gate 21 has a first concentration of N type dopants. The second portion 21b, which is proximate to the $N^+$ drain doping region 12, has a second concentration of N type dopants. According to this invention, the second concentration may be lower than the first concentration.

For example, the second portion 21b and the extended N type lightly doped region 14 may be formed concurrently by masking the gate 21, the sidewall spacer 22a and a portion of the active area 18 during the $N^+$ source/drain ion implantation process with a source/drain block layer 32. It should be noted that the boundary between portions 21a and 21b may be aligned with the boundary between the P well 20 and the substrate 10 or not. Since the second portion 21b has a reduced gate dopant concentration, the TDDB characteristic of the gate dielectric layer 24 between the gate 21 and the drain is significantly improved.

As best seen in FIG. 3, the high-voltage NMOS transistor 1 can be operated under the following conditions, for example, including: a gate voltage of −2V~0V, a source voltage of −4V, a drain voltage of −4V and a substrate voltage of −4V. It is one germane feature of this invention that the drain terminal can be negatively biased.

Figure 4:
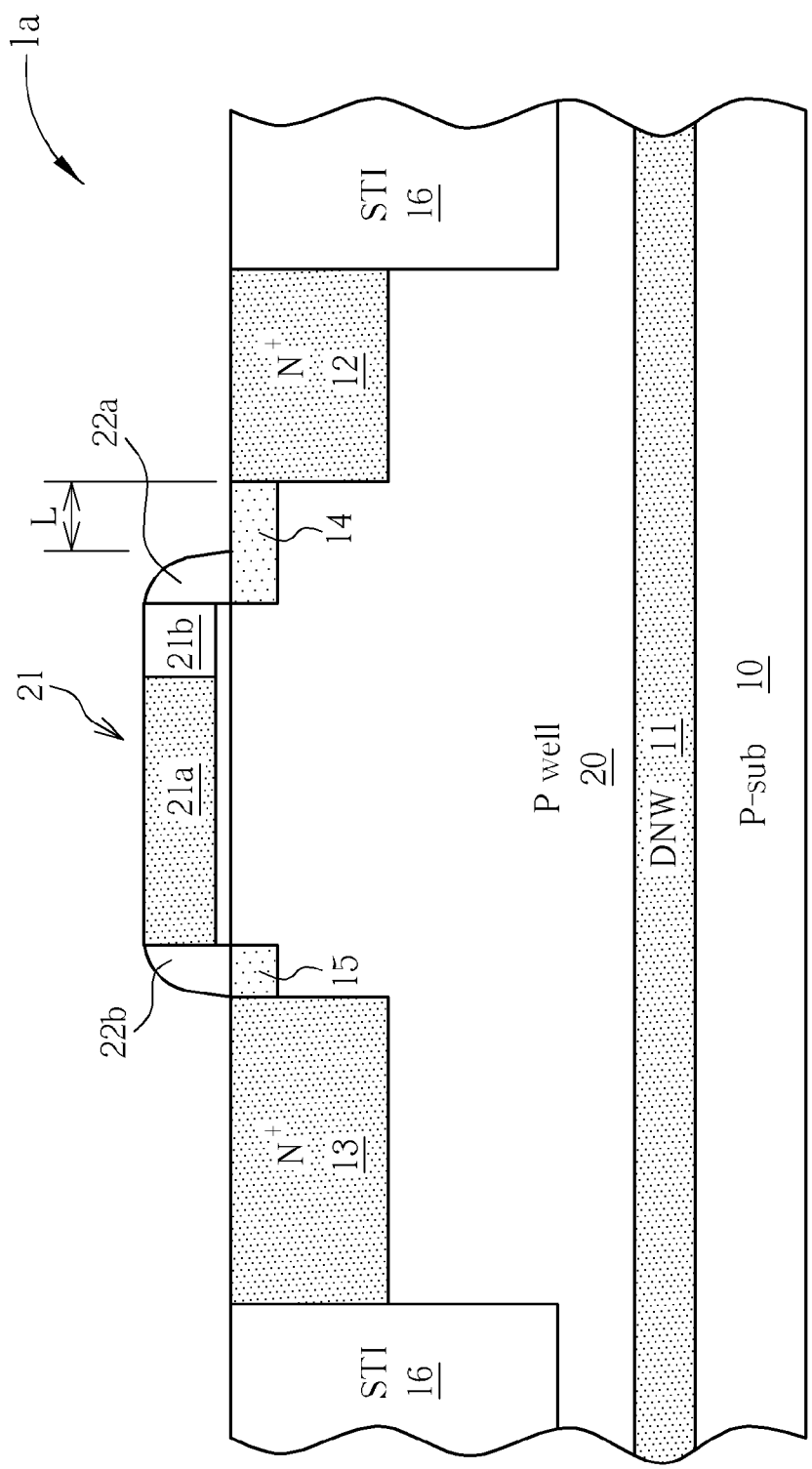
FIG. 4 is a schematic, cross-sectional diagram showing a high-voltage NMOS transistor structure in accordance with another embodiment of this invention.

FIG. 4 is a schematic, cross-sectional diagram showing a high-voltage NMOS transistor structure in accordance with another embodiment of this invention, wherein like numeral numbers designate like regions, layers or elements. As shown in FIG. 4, the high-voltage NMOS transistor 1a comprises a gate 21 overlying an active area surrounded by an STI region 16, an $N^+$ drain doping region 12 and an $N^+$ source doping region 13 in the P well 20, and deep N well 11 in the P type silicon substrate 10 for bulk isolation.

Likewise, the $N^+$ drain doping region 12 is pulled back away from the edge of the gate 21 by a distance L for increasing the drain side voltage drop and improving TDDB. An N type lightly doped region 14 is disposed between the edge of the gate 21 and the $N^+$ drain doping region 12. The N type lightly doped region 14 extends laterally underneath a sidewall spacer 22a that is formed on a sidewall of the gate 21. An N type lightly doped region 15 is provided underneath the sidewall spacer 22b opposite to the sidewall spacer 22a. The gate 21 may comprise two portions: the first portion 21a and the second portion 21b. The first portion 21a of the gate 21 has a first concentration of N type dopants. The second portion 21b, which is proximate to the $N^+$ drain doping region 12, has a second concentration of N type dopants. According to this invention, the second concentration is lower than the first concentration.

Figure 5:
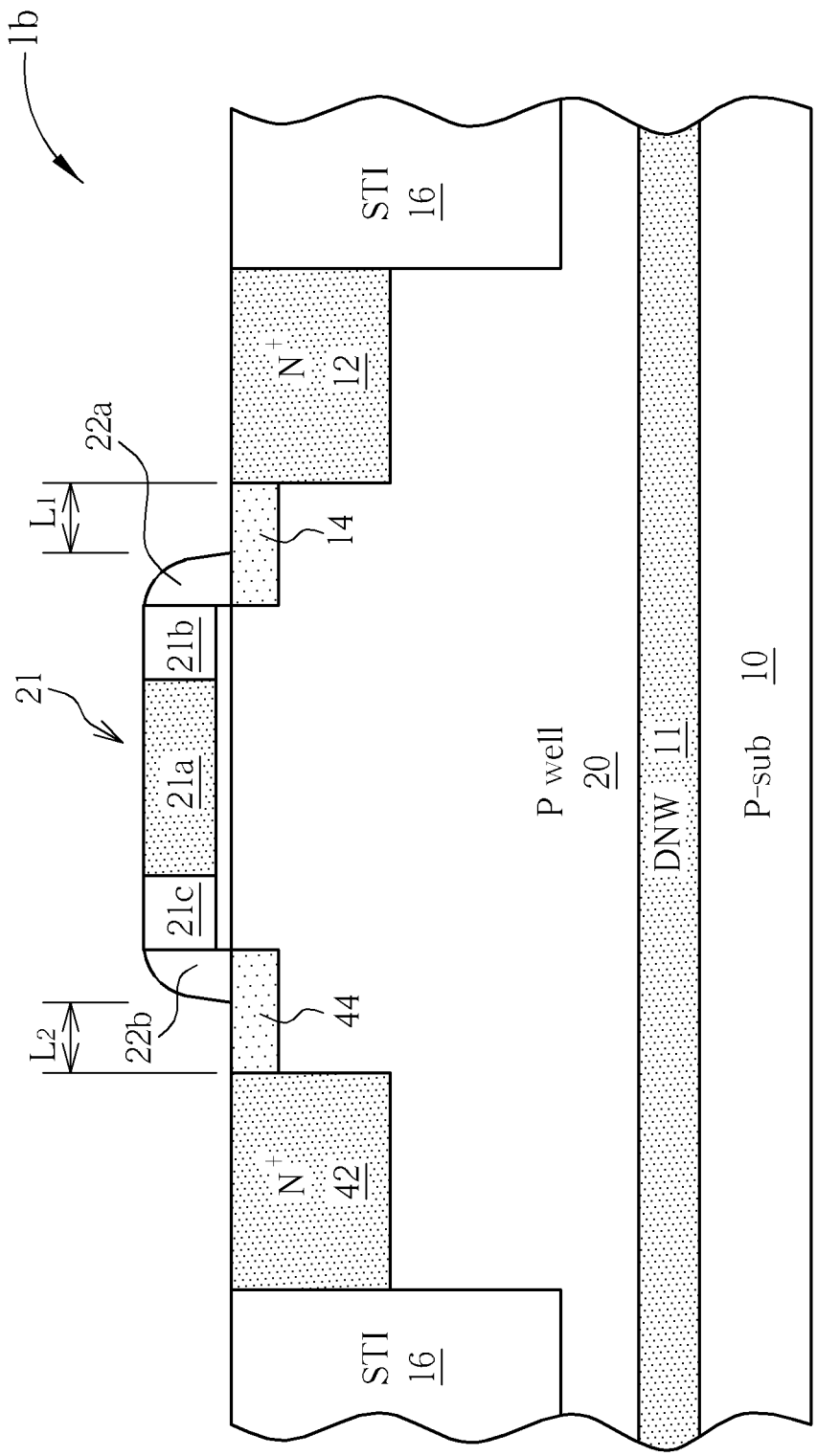
FIG. 5 is a schematic, cross-sectional diagram showing a symmetric high-voltage NMOS transistor structure in accordance with yet another embodiment of this invention.

FIG. 5 is a schematic, cross-sectional diagram showing a symmetric high-voltage NMOS transistor structure in accordance with yet another embodiment of this invention, wherein like numeral numbers designate like regions, layers or elements. As shown in FIG. 5, the high-voltage NMOS transistor 1b comprises a gate 21 overlying an active area surrounded by an STI region 16, an $N^+$ drain doping region 12 and an $N^+$ source doping region 42 both in a P well 20, and deep N well 11 in the P type silicon substrate 10 for bulk isolation. The $N^+$ drain doping region 12 and the $N^+$ source doping region 42 are both pulled back away from the edge of the gate 21 by distance $L_1$ and distance $L_2$ respectively. In one embodiment, the distance $L_1$ is equal to distance $L_2$.

An N type lightly doped region 14 is disposed between the edge of the gate 21 and the $N^+$ drain doping region 12. The N type lightly doped region 14 extends laterally underneath a sidewall spacer 22a. An N type lightly doped region 44 is disposed between the other edge of the gate 21 and the $N^+$ source doping region 42. The N type lightly doped region 44 extends laterally underneath a sidewall spacer 22b opposite to the sidewall spacer 22a.

The gate 21 may comprise three portions: the first portion 21a, the second portion 21b and the third portion 21c. The first portion 21a is sandwiched between the second and third portions 21b and 21c. The first portion 21a of the gate 21 has a first concentration of N type dopants. The second portion 21b, which is proximate to the $N^+$ drain doping region 12, has a second concentration of N type dopants. The third portion 21c, which is proximate to the $N^+$ source doping region 42, has a third concentration of N type dopants. According to this invention, the first concentration is higher than the second or third concentration. In one embodiment, the second concentration is substantially equal to the third concentration.

Figure 6:
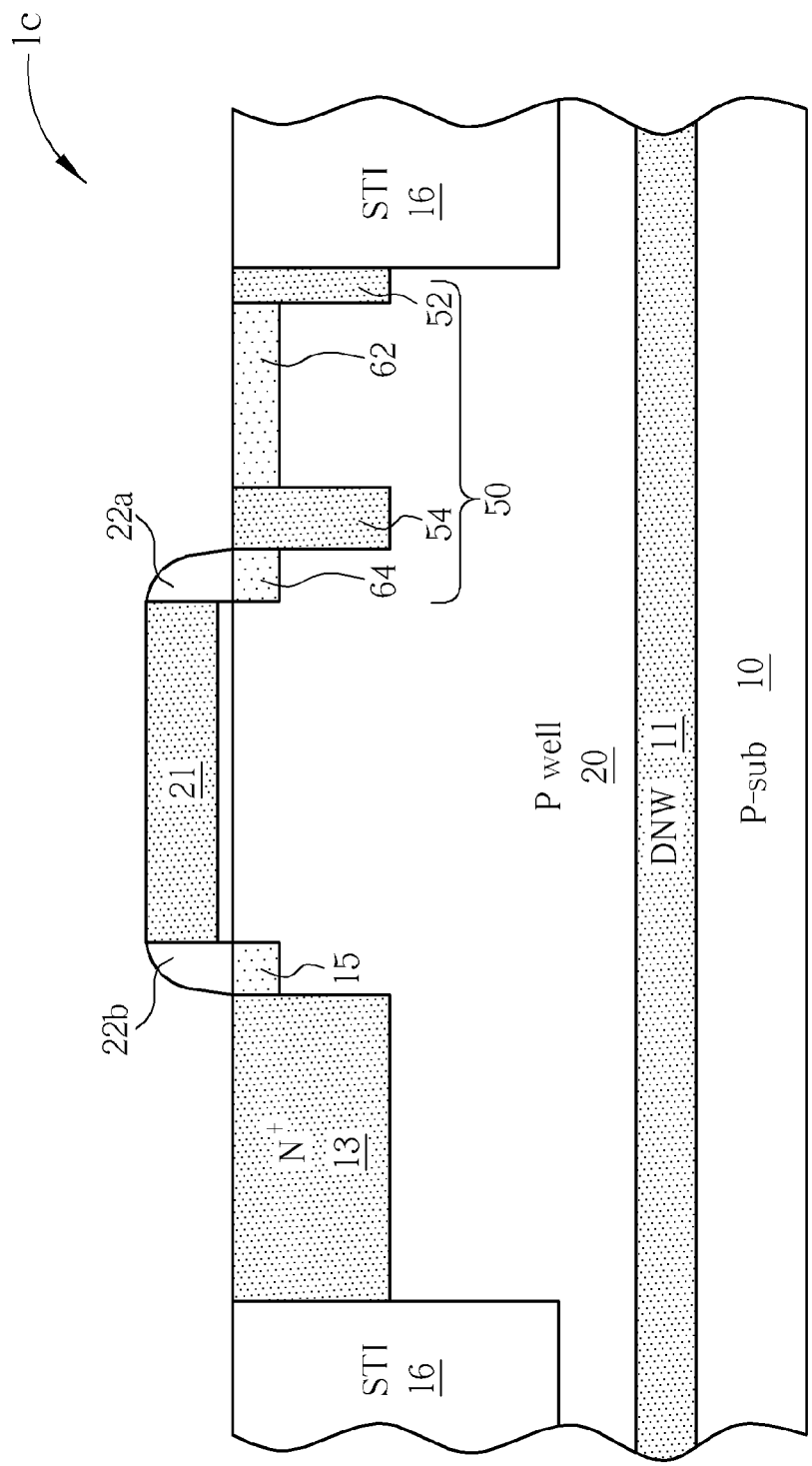
FIG. 6 is a schematic, cross-sectional diagram showing a high-voltage NMOS transistor structure in accordance with yet another embodiment of this invention.

FIG. 6 is a schematic, cross-sectional diagram showing a high-voltage NMOS transistor structure in accordance with yet another embodiment of this invention, wherein like numeral numbers designate like regions, layers or elements. As shown in FIG. 6, the high-voltage NMOS transistor 1c comprises a gate 21 overlying an active area surrounded by an STI region 16, an N+ source doping region 13 proximate to the spacer 22b in a P well 20, an N type lightly doped region 15 underneath the spacer 22b, and deep N well 11 in the P type silicon substrate 10 for bulk isolation.

The high-voltage NMOS transistor 1c further comprises a drain structure 50 in the P well 20. The drain structure 50 is proximate to the spacer 22a and comprises a first N+ doping region 52 spaced apart from a second N+ doping region 54 that is proximate to the gate 21. The drain structure 50 further comprises a first N type lightly doped region 62 interposed between the first and second N+ doping regions 52 and 54, and a second N type lightly doped region 64 disposed underneath the spacer 22a. To form the drain structure 50 and the N+ source doping region 13, for example, a source/drain block layer may be disposed above the first N type lightly doped region 62 during the N+ source/drain ion implantation process that is otherwise self-aligned with the gate 21 and the spacers 22a and 22b. The unique drain structure 50 has increased series resistance and the TDDB characteristic can be improved.

Figure 7:
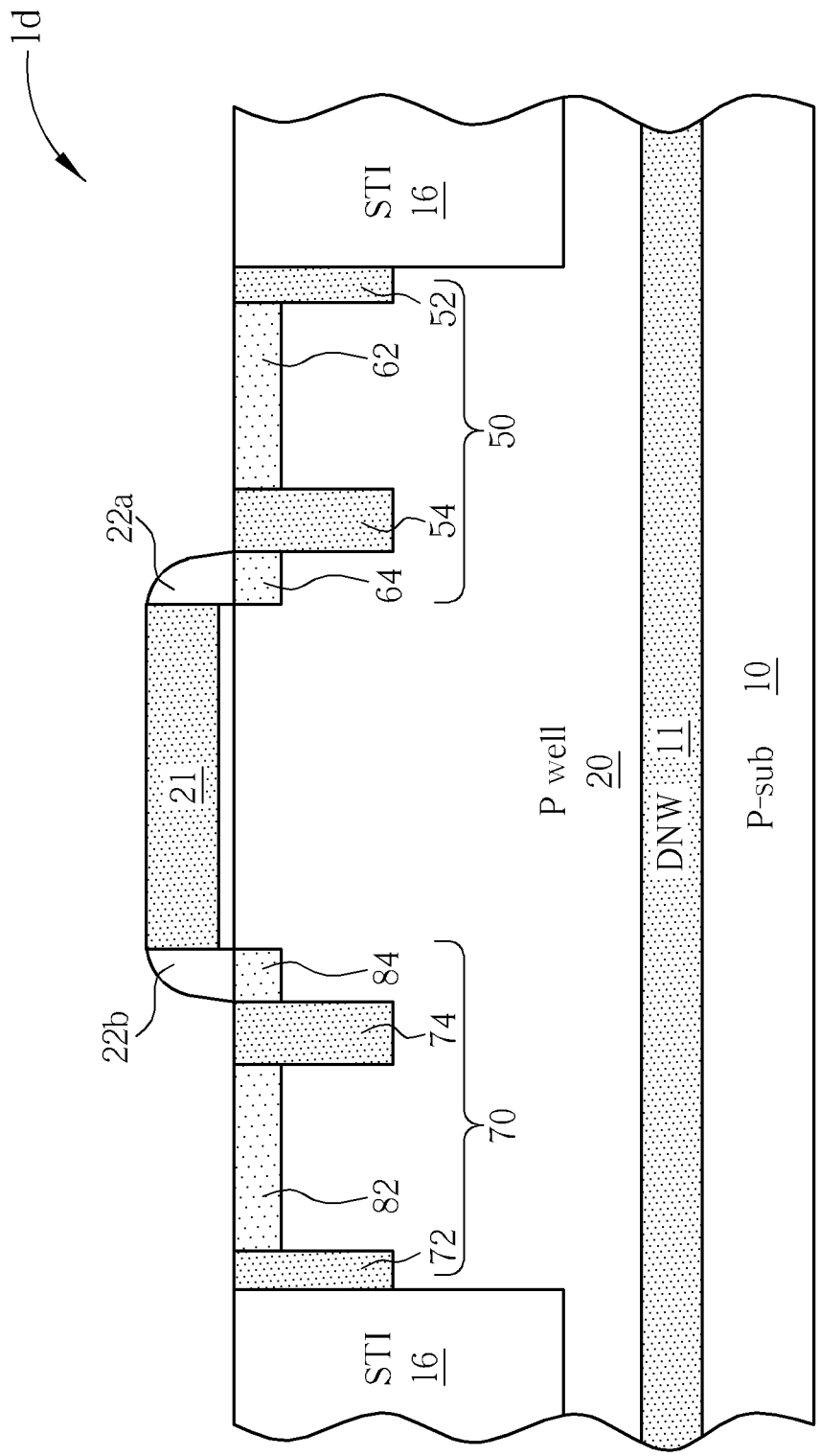
FIG. 7 is a schematic, cross-sectional diagram showing a symmetric high-voltage NMOS transistor structure in accordance with yet another embodiment of this invention.

FIG. 7 is a schematic, cross-sectional diagram showing a symmetric high-voltage NMOS transistor structure in accordance with yet another embodiment of this invention, wherein like numeral numbers designate like regions, layers or elements. As shown in FIG. 7, the high-voltage NMOS transistor 1d comprises a gate 21 overlying an active area surrounded by an STI region 16, a drain structure 50 and a source structure 70 in a P well 20, and deep N well 11 in the P type silicon substrate 10 for bulk isolation. The drain structure 50 of the high-voltage NMOS transistor 1d may be identical to that as set forth in FIG. 6.

Likewise, the drain structure 50 is proximate to the spacer 22a and comprises a first N+ doping region 52 spaced apart from a second N+ doping region 54 that is proximate to the gate 21. The drain structure 50 further comprises a first N type lightly doped region 62 interposed between the first and second N+ doping regions 52 and 54, and a second N type lightly doped region 64 disposed underneath the spacer 22a. The source structure 70 may be a mirror image of the drain structure 50. The source structure 70 is proximate to the spacer 22b and comprises a first N+ doping region 72 spaced apart from a second N+ doping region 74 that is proximate to the gate 21. The drain structure 70 further comprises a first N type lightly doped region 82 interposed between the first and second N+ doping regions 72 and 74, and a second N type lightly doped region 84 disposed underneath the spacer 22b.

Figure 8:
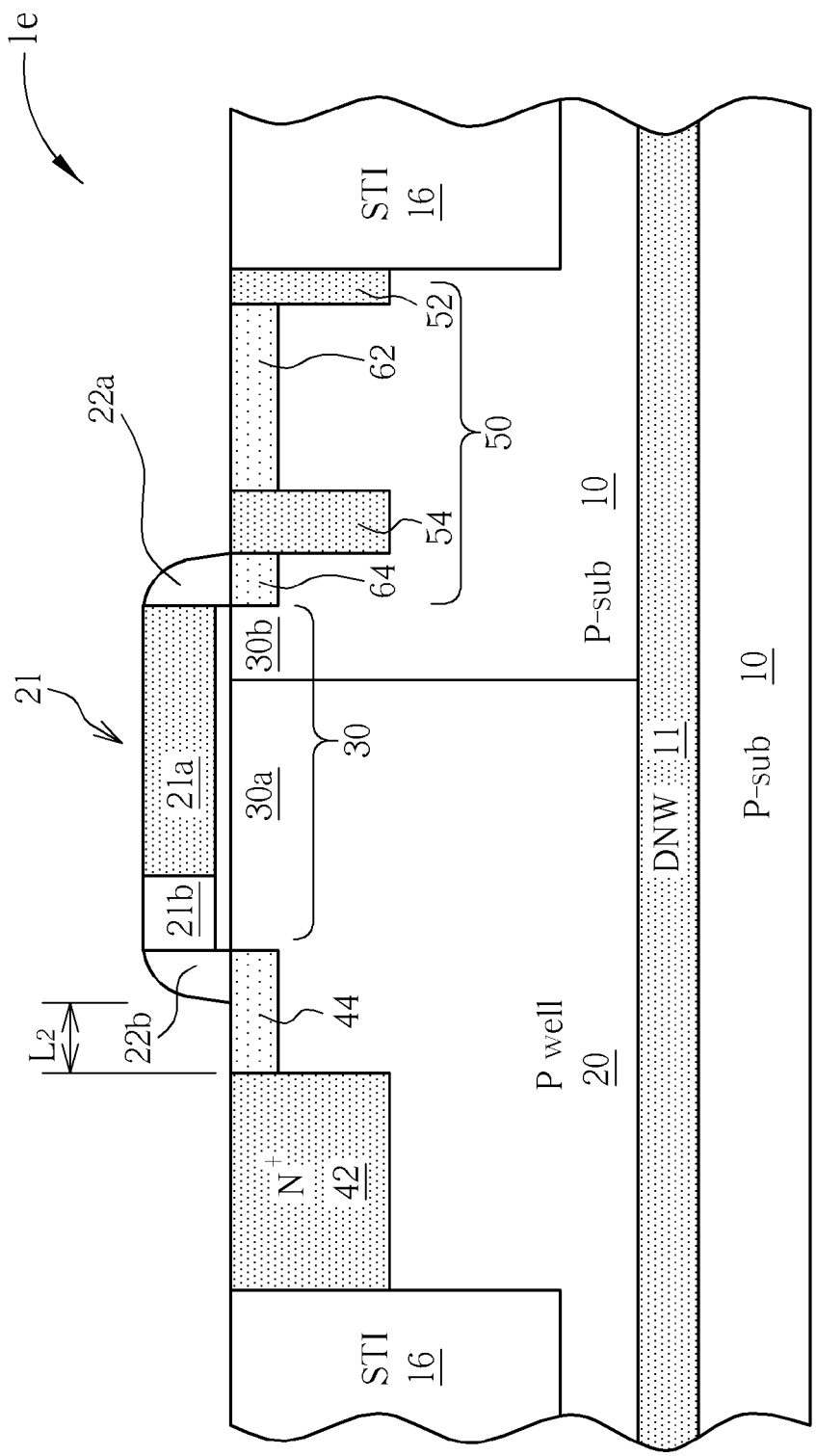
FIG. 8 is a schematic, cross-sectional diagram showing an asymmetric high-voltage NMOS transistor structure in accordance with yet another embodiment of this invention.

FIG. 8 is a schematic, cross-sectional diagram showing a asymmetric high-voltage NMOS transistor structure in accordance with yet another embodiment of this invention, wherein like numeral numbers designate like regions, layers or elements. As shown in FIG. 8, the high-voltage NMOS transistor 1e comprises a gate 21 overlying an active area surrounded by an STI region 16, a drain structure 50 in the P type silicon substrate 10, and deep N well 11 in the P type silicon substrate 10 for bulk isolation. The drain structure 50 of the high-voltage NMOS transistor 1e may be substantially identical to that as set forth in FIG. 6 except for that the drain structure 50 is not formed in the P well 20. On the other side of the gate 21 (opposite to the drain structure 50), an N+ source doping region 42 is provided in the P well 20. The N+ source doping region 42 is pulled back away from the edge of the gate 21 by distance $L_2$. An N type lightly doped region 44 is disposed between the edge of the gate 21 and the N+ source doping region 42. The N type lightly doped region 44 extends laterally underneath a sidewall spacer 22b opposite to the sidewall spacer 22a.

The gate 21 may comprise two portions: the first portion 21a and the second portion 21b. The first portion 21a of the gate 21 has a first concentration of N type dopants. The second portion 21b, which is proximate to the N+ source doping region 42, has a second concentration of N type dopants. According to this invention, the first concentration may be higher than the second concentration. The channel region 30 may comprise a first portion 30a of the P well 20 and a second portion 30b of the P type silicon substrate 10. Accordingly, the high-voltage NMOS transistor 1e has different P type doping concentrations across the channel region 30.

To sum up, the present invention high-voltage MOS transistor at least includes the following features.

(i) The present invention high-voltage MOS transistor is compatible with standard CMOS processes and no additional cost is required.

(ii) The deep N well (DNW) may be introduced for bulk isolation.

(iii) In some embodiments, the drain structure is formed in the native P type silicon substrate, while the source terminal is formed in the P well. By doing this, the hot carrier injection (HCI) effect is reduced.

(iv) The gate doping concentration may be reduced at gate/drain overlapping region to increase TDDB of gate oxide in the gate/drain overlapping region.

(v) The N+ drain doping regions that is pulled back away from the edge of the gate increase the voltage drop of drain side and improve TDDB.

(vi) The introduction of the source/drain block layer during the N+ source/drain ion implantation process creates a unique drain structure 50 having increased series resistance and improved TDDB characteristic.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage MOS transistor, comprising:
   a gate overlying an active area of a semiconductor substrate;
   a drain structure of a first conductivity type at one side of the gate, wherein the drain structure comprises a first heavily doping region spaced apart from a second heavily doping region that is proximate to the gate, a first lightly doped region interposed between the first and second heavily doping regions, and a second lightly doped region between the gate and the second heavily doping region;
   a source doping region of the first conductivity type in a first ion well of a second conductivity type at the other side of the gate; and
   a third lightly doped region of the first conductivity type between the gate and the source doping region.

2. The high voltage MOS transistor according to claim 1, wherein the semiconductor substrate is of the second conductivity type, the high voltage MOS transistor further comprises a second ion well of the first conductivity type in the semiconductor substrate for bulk isolation, wherein the first ion well is above the second ion well.

3. The high voltage MOS transistor according to claim 1 wherein the drain structure is not formed in the first ion well.

4. The high voltage MOS transistor according to claim 1 wherein the drain structure, the source doping region and the third lightly doped region are formed in the first ion well.

5. The high voltage MOS transistor according to claim 1 wherein the gate comprises two portions: a first portion and a second portion, and wherein the first portion of the gate has a first concentration of dopants, the second portion, which is proximate to the drain doping region, has a second concentration of dopants.

6. The high voltage MOS transistor according to claim 5 wherein the second concentration is lower than the first concentration.

7. The high voltage MOS transistor according to claim 1 wherein a shallow trench isolation (STI) region surrounds the active area.

8. The high voltage MOS transistor according to claim 1 wherein the gate comprises a sidewall spacer.

* * * * *